(12) United States Patent
Ben-Rubi

(10) Patent No.: US 7,961,544 B2
(45) Date of Patent: Jun. 14, 2011

(54) STORAGE SYSTEM AND METHOD FOR MANAGING A PLURALITY OF STORAGE DEVICES

(75) Inventor: Refael Ben-Rubi, Rosh Ha'ayin (IL)

(73) Assignee: Sandisk Il Ltd., Kfar Saba (IL)

( * ) Notice: Subject to any disclaimer, the term of this patent is extended or adjusted under 35 U.S.C. 154(b) by 375 days.

(21) Appl. No.: 12/186,417

(22) Filed: Aug. 5, 2008

(65) Prior Publication Data
US 2010/0036998 A1 Feb. 11, 2010

(51) Int. Cl.
*G11C 5/14* (2006.01)
(52) U.S. Cl. .......... 365/226; 365/227; 365/185.11; 365/185.17; 713/300; 713/320
(58) Field of Classification Search .......... 365/226, 365/233, 227, 185.11, 185.17; 711/300, 711/340, 114; 713/300, 320
See application file for complete search history.

(56) References Cited

U.S. PATENT DOCUMENTS

| | | | |
|---|---|---|---|
| 5,537,350 A | 7/1996 | Larsen | |
| 5,553,020 A | 9/1996 | Keeney | |
| 5,699,298 A | 12/1997 | Shiau | |
| 6,134,145 A | 10/2000 | Wong | |
| 7,082,060 B2 * | 7/2006 | Roohparvar | 365/185.3 |
| 7,315,484 B2 * | 1/2008 | Yang et al. | 365/226 |
| 7,340,618 B2 * | 3/2008 | Kark et al. | 713/300 |
| 7,512,816 B2 * | 3/2009 | Ootsuka et al. | 713/300 |
| 2005/0289367 A1 | 12/2005 | Clark et al. | |
| 2007/0096562 A1 | 5/2007 | Bainbridge et al. | |
| 2007/0211551 A1 * | 9/2007 | Yogev et al. | 365/226 |

FOREIGN PATENT DOCUMENTS

| | | |
|---|---|---|
| EP | 1 688 866 | 8/2006 |
| WO | WO2008/017624 | 2/2008 |

OTHER PUBLICATIONS

International Search Report dated Oct. 22, 2009 in PCT Application No. PCT/IL2009/000753.
Written Opinion dated Oct. 22, 2009 in PCT Application No. PCT/IL2009/000753.

* cited by examiner

*Primary Examiner* — Pho M Luu
*Assistant Examiner* — Tha-O Bui
(74) *Attorney, Agent, or Firm* — Beyer Law Group LLP

(57) ABSTRACT

A method of managing operation of a plurality of storage devices includes receiving current consumption information from at least one of the plurality of storage devices; and managing operation of at least one storage device, the operation management including permitting current consumption of a first one of the storage devices based on current consumption information that pertains to at least a second one of the storage devices. Also provided is a storage system that includes a plurality of storage devices, where each storage devices is configured to store data. A state machine, connected to each of the storage devices, is operative to permit current consumption of a first storage device based on current consumption information pertaining to at least a second storage device.

18 Claims, 7 Drawing Sheets

|  | Amount of Current Consumed by a storage device at "high Current state" | Time required for a storage device to be in "high current state" | Amount of current consumed by storage device at "low current state" | Time required for a storage device to be in "low current state" | Priority | Operational state |
|---|---|---|---|---|---|---|
| SDa1 | 50mA | 20usec | 7mA | 30usec | high | operational |
| SDa2 | 50mA | 20usec | 7mA | 30usec | high | operational |
| SDa3 | 50mA | 20usec | 7mA | 30usec | low | malfunction |
| SDa4 | 50mA | 20usec | 7mA | 30usec | medium | operational |
| SDa5 | 50mA | 20usec | 7mA | 30usec | low | Sleep mode |

FIG. 5

STORAGE SYSTEM AND METHOD FOR MANAGING A PLURALITY OF STORAGE DEVICES

FIELD OF THE INVENTION

The present invention relates generally to storage devices. More particularly, the invention relates to managing operation of a plurality of storage devices.

BACKGROUND OF THE INVENTION

Writing data into, and erasing data from, a flash memory requires an electrical current that is provided by a voltage source known as a "charge pump". Briefly, a charge pump, as used in a flash memory, is an electric circuit that generates a relatively high voltage that is used to manipulate the amount of electrical charge within flash memory cells to write new data into these cells, to erase data from memory cells, and to read data from these cells. Being a voltage source, a charge pump is designed to provide an electrical current whose value is permitted to change from zero to some maximal value beyond which the level of the output voltage of the charge pump starts to decrease uncontrollably.

It may occasionally occur that, in a storage system that includes several storage devices, storage operations (e.g., writing data and erasing data) may need to be performed simultaneously in two or more storage devices. However, for the reason stated above, writing data into, and erasing data from, several storage devices simultaneously is limited by the maximum current that can be provided by the charge pump and, with more than one storage device operating simultaneously typically on peak current consumption level, there is a danger that the total current that is consumed by these storage devices would exceed the maximum allowable current. Under such circumstances, the voltage provided to the storage devices from a power supply or from the charge pump will drop below a valid operation level, causing the storage device to behave unpredictably. In such a case, the data that was last programmed to the storage device could be lost.

There is, therefore, a need to for a storage system that can perform multiple storage operations simultaneously in a controlled manner, without jeopardizing the operating voltage level associated with such operations.

SUMMARY OF EXEMPLARY EMBODIMENTS

In view of the foregoing observations and the present needs, it would be desirable to have a storage system and method for managing current consumption of a plurality of storage devices, where the current consumption management may include controlling current consumption of one storage device based on current consumption information pertaining to the storage device and/or at least one other storage device of the plurality of storage devices.

Embodiments, various examples of which are discussed herein, may include a method of managing operation of a plurality of storage devices that includes receiving current consumption information from at least one of the plurality of storage devices; and managing operation of at least one of the plurality of storage devices, where the operation management includes permitting current consumption of a first one of the plurality of storage devices based on current consumption information that pertains to at least a second one of the plurality of storage devices.

The current consumption information may include a real-time indication of current consumption of at least the second one of the plurality of storage devices, and may be dynamically updated.

The managing may further include (a) programming of data onto the first one of the plurality of storage devices, erasing of data from the first one of the plurality of storage devices, and reading of data stored on the first one of the plurality of storage devices, or (b) programming of data onto the second one of the plurality of storage devices, erasing of data from the second one of the plurality of storage devices, and reading of data stored on the second one of the plurality of storage devices, based on the current consumption information.

The permitting may include suspending current consumption of the first one of the plurality of storage devices and permitting current consumption of another one of the plurality of storage devices to be resumed, based on the current consumption information, or permitting current consumption of the first one of the plurality of storage devices to be resumed and suspending current consumption of another one of the plurality of storage devices, based on the current consumption information. The permitting may be based on a priority assigned to at least one of the plurality of storage devices. The priority may be based on a degree of immunity to change in current consumption, a level of activity, a type of content associated with and/or a configuration of the at least one of the plurality of storage devices to which the priority is assigned.

The method may also include connecting at least one of the plurality of storage devices directly to another one of the plurality of storage devices. The first one of the plurality of storage devices may be directly connected to at least another one of the plurality of storage devices, and the current consumption of this first storage device may be permitted in response to a signal received by the first storage device from at least the second one of the plurality of storage devices.

Also provided is a storage system that includes a plurality of storage devices, where each of the plurality of storage devices being configured to store data; and a state machine that is connected to each of the storage devices. The state machine is operative to manage operation of at least one of the plurality of storage devices. The operation management includes permitting current consumption of a first one of the plurality of storage devices based on current consumption information that pertains to at least a second one of the plurality of storage devices.

At least one of the storage devices may have a configuration complying with flash memory technology; and may be a dedicated non-removable storage device that is not removable from the apparatus or a removable storage device that is configured for removal from and addition to the storage system, the removable storage device including a memory card.

Also provided is a storage device operationally connected to a state machine and to one or more other storage device that includes: a storage portion configured to store data; and circuitry that is operative to manage operation of the storage portion. The operation management includes permitting current consumption of the storage device based on current consumption information that pertains to at least one other storage device operationally connected to the storage device. Permitting of the current consumption may be carried out based on a command received from a state machine.

Also provided is a device for managing a plurality of storage devices that includes: a state machine that is operationally connected to a plurality of storage devices. The state machine is operative to manage operation of at least one of the plurality of storage devices. The operation management includes permitting current consumption of a first one of the plurality of storage devices based on current consumption information that pertains to at least a second one of the plurality of storage devices.

Additional features and advantages of the embodiments described are possible as will become apparent from the following drawings and description.

BRIEF DESCRIPTION OF THE DRAWINGS

For a better understanding of the various embodiments, reference is made to the accompanying drawings, in which like numerals may designate corresponding sections or elements throughout, and in which:

FIG. 5 shows the way current consumption information is stored on a database of information of the storage system of FIG. 1.

DETAILED DESCRIPTION OF EXEMPLARY EMBODIMENTS

Figure 1:
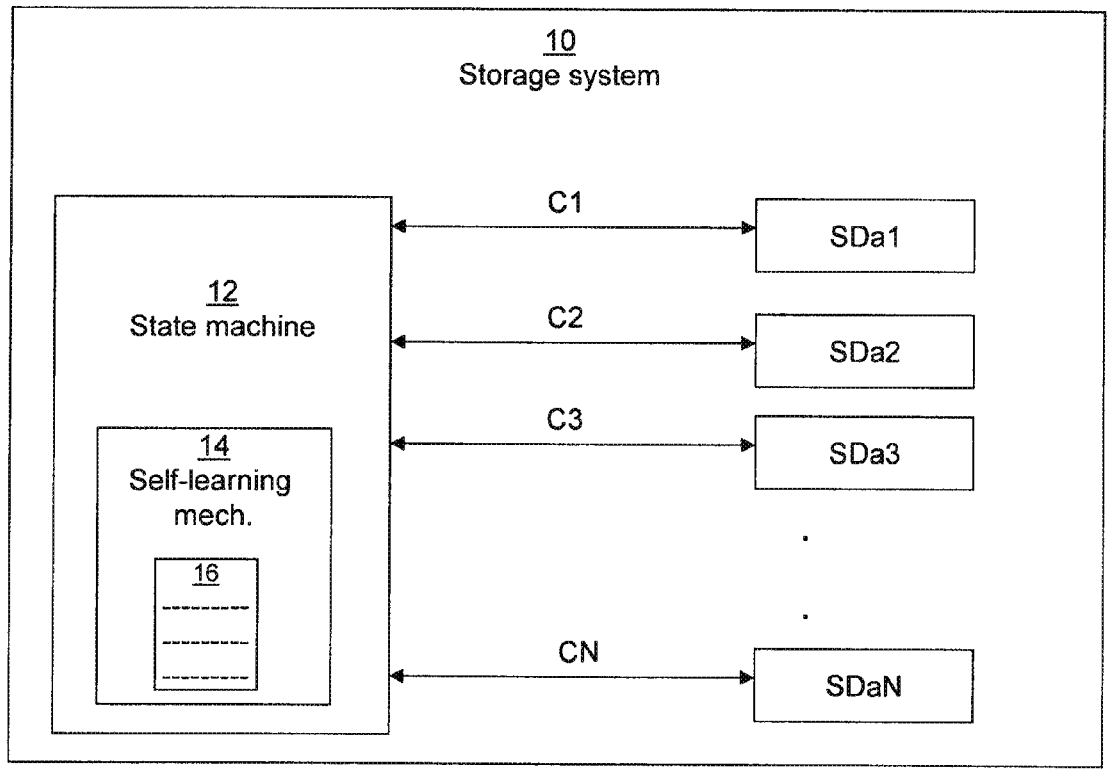
FIG. 1 shows a storage system having a plurality of storage devices according to an example embodiment.

Example embodiments and various aspects thereof are further described in more detail below. This description is not intended to limit the scope of claims but instead to provide example embodiments. The following discussion therefore presents exemplary embodiments, which include various storage systems for managing a plurality of storage devices.

Although the present disclosure refers to non-volatile storage devices, it may likewise be relevant to, or be used with, volatile storage device. By way of example, non-volatile storage devices may be of the FLASH or EEPROM type.

The storage device used herein may be any storage device known in the art that is operative to connect directly to and communicate directly with a host. Such storage device may have a configuration that complies with a memory card format, including a secured digital memory card format and a multimedia card format. The storage device may include an array of memory cells (such as FLASH) having the capacity to store data in binary form in either a volatile or non-volatile manner. Note that having FLASH type memory cells is not meant as a limitation, as other embodiments using any appropriate type of memory cell are further applicable.

Memory cards, which are commonly used to store digital data, are used with various electronic devices. Some memory cards are referred to as "embedded" cards and some memory cards are referred to as "removable" cards, which means that they can easily be moved by an end-user from one electronic device to another, thereby rendering the digital data stored in them portable data. The memory cards can have a relatively small form factor and can be used to store digital data for electronic devices that require data storage, such as digital cameras, media players/recorders (e.g., MP3 players), hand-held or notebook computers, personal digital assistants (PDAs), cellular phones, network cards, network appliances, set-top boxes, and hand-held or other devices.

Nonetheless, the present disclosure may employ any mass storage device, whether it is a removable storage device that is configured for connection to and removal from the storage system or a dedicated storage device that is embedded within a storage system.

Accordingly, the storage devices discussed herein may have a configuration that complies with any memory type (e.g. flash memory) and/or memory card format (e.g., a secured digital ("SD") memory card format) used for storing multimedia content such as audio, video, or picture files. The storage device may also have a configuration that complies with a multi media card ("MMC") format, a compact flash ("CF") format, a flash PC (e.g., ATA Flash) format, a smartmedia format, a USB flash drive, a memory stick format, or with any other industry standard format.

The storage device may have a non-volatile memory that retains its memory or stored state even when power is removed. The storage device may also employ an erasable programmable memory technology, e.g. an electrically-erasable and programmable read-only memory (EEPROM), EPROM, MRAM, FRAM ferroelectric, magnetic or other memory. Note that the device configuration does not depend on the type of memory, and may be implemented with any type of memory, be it a flash memory or another type of memory. The device may also be implemented with a memory chip and/or with three-dimensional (3D) memory chip technology.

The host discussed herein may be a personal computer, a notebook computer, a hand held computing device, such as a PDA (Personal Digital Assistant) or mobile handset, a cellular telephone, a camera, an audio reproducing device, or any other electronic device that work with removable data storage. A host may have various personal information management applications, such as an address book, a daily organizer, and electronic notepads, to name a few.

FIG. 1 is a block diagram of a storage system 10 according to an example embodiment. Storage system 10 typically includes a plurality of storage devices designated as "SDa1", "SDa2", "SDa3", . . . , "SDaN", which are operatively connected to a state machine 12.

Typically, storage devices SDa1 through SDaN of storage system 10 are similar or identical; i.e., they are configured likewise and, therefore, store data in a similar manner. However, storage devices may be configured differently.

State machine 12 may be, for example, a controller or a CPU that controls the operation of storage devices SDa1 through SDaN. State machine 12 may be implemented in software, hardware, firmware, or any combination thereof.

State machine 12 controls operation (i.e., storage operations) of a particular one of storage devices SDa1 through SDaN based on information (the information being referred to herein as "current consumption information") pertaining to the electrical current consumption of at least another one of storage devices SDa1 through SDaN. For example, storage system 10 may control the operation of storage device SDa1 based on current consumption information associated with, related to, or pertains to, at least storage device SDa2. For example storage system 10 may control the operation of SDa1 based on current consumption information associated with, related to, or pertains to SDa2, SDa3, and SDaN.

The current consumption information may be communicated to state machine 12 from storage devices SDa1, SDa2, SDa3, . . . , SDaN, or be provided to state machine 12 on their behalf. Additionally or alternatively, the current consumption information is made available to state machine 12 from the storage device manufacturer or from another device and stored on a database of information 16 (see table 100 of FIG. 5). Database of information 16 may be stored on state machine 12 or accessible by state machine 12.

Figure 2:
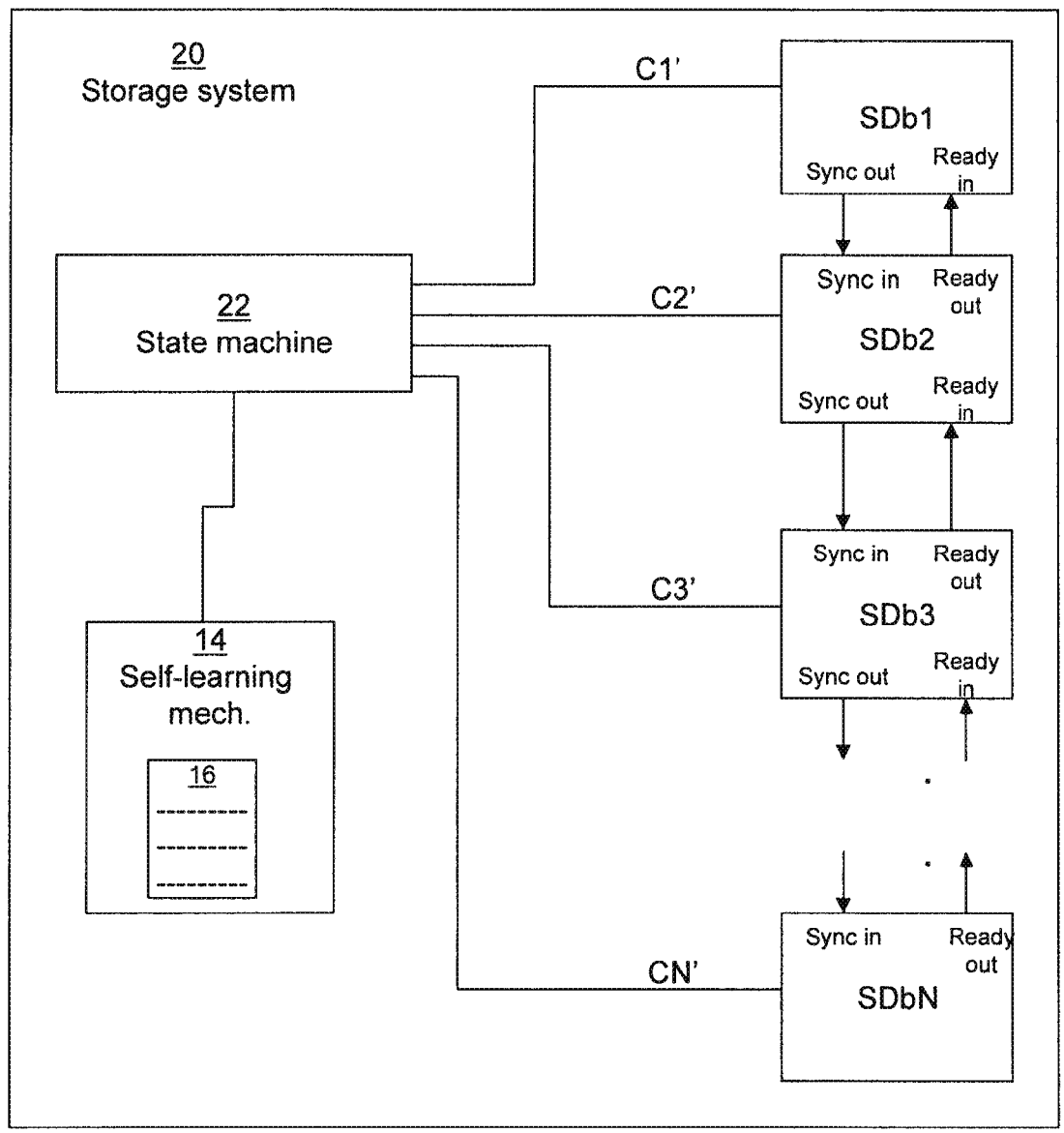
FIG. 2 shows a storage system having a plurality of storage devices according to another example embodiment.

As already mentioned above, state machine 12 may be connected to different types of storage devices require low and high current consumption level at different times. Accordingly, a self-learning mechanism 14 is provided in order for it to teach or train state machine 12 to develop database of information 16 to include information that is associated with the current consumption level that is required for future control of each storage device by state machine 12. Such tracking can be further used for a variety of purposes, including transferring information associated with the current consumption information to an external unit, etc. Self-learning mechanism 14 may be implemented, embedded or incorporated into state machine 12, as shown in FIG. 1, or it may be external to, and operatively connected to, state machine 12, as shown in FIG. 2.

A basic control over the current consumption of storage devices SDa1, SDa2, SDa3, ..., SDaN is performed as described below. State machine 12 continually and separately communicates with each of storage devices SDa1, SDa2, SDa3, ..., SDaN. Each of storage devices SDa1, SDa2, SDa3, ..., SDaN is uniquely identified to state machine 12, e.g., by using identifiers (e.g., identification numbers) that are arbitrarily assigned to the storage devices.

In order to facilitate management of the current consumption of storage devices SDa1, SDa2, SDa3, ..., SDaN by state machine 12, current consumption information is exchanged (either continually, occasionally, or intermittently) between each of storage devices SDa1, SDa2, SDa3, ..., SDaN and state machine 12.

The state machine 12 is operable to synchronize between the storage devices. In other words, the state machine 12 controls the timing at which each of the storage devices SDa1, SDa2, SDa3, ..., SDaN operates, so as to ensure that the total amount of electrical current that is collectively consumed at any given time by all the storage devices SDa1, SDa2, SDa3, ..., SDaN does not exceed a maximum operational value beyond which reliable operation of storage system 10 cannot be ensured or guaranteed.

While in communication with each of storage devices SDa1, SDa2, SDa3, SDaN, state machine 12 controls programming (i.e., writing), erasing and reading of data to and from one storage device based on the current consumption information pertaining to at least another such storage device. State machine 12 may communicate with the storage devices SDa1, SDa2, SDa3, ..., SDaN using any suitable communication protocol. For example, as shown in FIG. 1, communication links C1, C2, C3, ..., CN may respectively be used for transferring storage commands and Synchronization signals from state machine 12 to the storage devices SDa1, SDa2, SDa3, ..., SDaN, and for transferring current consumption information in the opposite way; i.e., from the storage devices SDa1, SDa2, SDa3, ..., SDaN to state machine 12.

A storage command may be, for example, a data read command, a data write (program) command, and a data erase command.

In the context of the present disclosure, a Synchronization signal is a message telling a storage device (e.g., the storage device designated as SDa1) that it is permitted to consume up to a certain current level (e.g., up to the maximal current available by the storage system). The Synchronization signal may be generated by and forwarded from a state machine to the storage device with which it operates, as demonstrated in FIG. 1. Alternatively or additionally, the storage system may generate and exchange synchronization signals among themselves, as demonstrated in FIG. 2. A synchronization signal may be forwarded to a storage device at any point of time.

In the context of the disclosure, "information" and "current consumption information" may include any real time information that is dynamically updated (i.e., by a state machine or by a storage devices) over time, and/or information indicating a fixed, predefined, scheduling that is indicative of expected timing of different (e.g., high, medium and low) current consumption levels. Current consumption information originating from a storage device may also include a unique storage device identifier that identifies the storage device to state machine 12. The current consumption information of each storage device may be provided to the state machine by the storage devices themselves, and/or may be embedded in the state machine 12 during manufacturing.

Storage device 10 is configured such that prior to initial operation of each storage device, a storage device is configured (e.g. during manufacturing) or instructed by state machine 12 to operate at high current consumption level in response to receiving a corresponding synchronization signal. In other words, the storage devices of storage system 10 are not permitted to resume high current consumption level, and/or to operate above a certain current consumption threshold unless they get a permission to do so by an appropriate command. State machine 12 transmits a Sync. signal to one storage device (e.g., SDa1), permitting it to operate at a high current consumption level, while permitting the remainder of the storage devices (e.g., SDa2, SDa3, ..., SDaN) to operate at a lower current consumption level.

In the context of the present disclosure, "permitting a storage device to operate at a high current consumption level, while permitting the remainder storage devices to operate at a lower current consumption level" means that the storage system enables this one storage device to consume high and/or maximum allowed current consumption level (as typically defined in the configuration), while temporarily enabling the other storage devices of the storage system to consume low and/or minimum current consumption level (as typically defined in the configuration). Alternatively or additionally, "permitting one storage device to operate at a first current consumption level, while permitting the remainder storage devices to operate at a second current consumption level" may mean that a signal is sent to this one storage device, thus enabling the current consumption of this one storage device, while temporarily disabling the current consumption of the other storage devices.

The storage devices are designated to operate at high and low current consumption levels, usually during manufacturing. Typically, a storage device consumes a relatively high current when it performs any storage operation and a low current otherwise, e.g., when the storage device is in an idle state.

In an exemplary embodiment state machine 12 respectively forwards storage commands and Sync signals via communication links C1, C2, C3, ..., CN to storage devices SDa1, SDa2, SDa3, ..., SDaN.

For example, state machine 12 may be programmed to issue a program command to three storage devices simultaneously in the following manner: permitting storage device SDa1 to consume a relatively high level of current throughout a first slot of 50 microseconds (μsec) of the programming operation; then prompting storage device SDa2 to consume a relatively high level of current throughout a first subsequent slot 50 μsec of the programming operation (while permitting SDa1 to operate at low current consumption level), and only then permitting storage device SDa3 to consume a relatively high level of current throughout a second subsequent 50 μsec time slot of the programming operation (while permitting storage device SDa2 at a low current consumption level).

In another implementation, state machine 12 enables a particular storage device to consume high current consumption in response to a Ready signal that is received from another storage device. In the context of this disclosure, a "Ready" signal is a signal issued by a storage device to notify state machine 12 that the storage device in question has finished to operate at a high current consumption level. The Ready signal, being a real-time indication, may be issued and sent from one storage device to another either directly or indirectly (e.g., via state machine 12). Ready signals may be transferred from storage devices SDa1, SDa2, SDa3, . . . , SDaN to state machine 12, for example, via communication links C1, C2, C3, . . . , CN.

For the sake of explanation it is assumed that each of storage devices SDa1, SDa2, SDa3, . . . , SDaN is configured to consume current conditional on a corresponding a Sync. Signal from state machine 12. In other words, a storage device may not be enabled to consume current if it has not received a Sync. Signal permitting this storage device to do so.

According to the schedule of state machine 12, SDa1 is the only storage device that is permitted to operate at a high current consumption level. As such, state machine 12 forwards a Sync. Signal to storage device SDa1, for example via communication channel C1, permitting storage device SDa1 to consume current. Such Sync signal may specify to storage device SDa1 the time slot during which the storage device is allowed to consume the highest current available.

It is noted that even though state machine 12 allots a time slot to storage device SDa1 during which storage device SDa1 is permitted to consume high current, storage device SDa1 does not necessarily use the allotted time slot to execute a high-current demanding operation. In other words, if, during the allotted time slot, storage device SDa1 needs to execute an operation that requires high current, storage device SDa1 will execute that operation during the allotted time slot. When storage device SDa1 no longer needs to operate at a high current consumption level, storage device SDa1 transmits a Ready signal to state machine 12, indicating to state machine 12 that storage device SDa1 has completed execution of a high-current demanding operation, or that storage device SDa1 does not plan to execute now an operation that requires high current. Upon, subsequent, or responsive to receiving the Ready signal, state machine 12 transmits a Sync signal to another one of storage devices SDa1, SDa2, SDa3, . . . , SDaN, permitting that storage device to operate at the high current consumption level.

The next storage device, among storage devices SDa1, SDa2, SDa3, . . . , SDaN, to receive a permission from state machine 12 to operate at the high current level may be selected by state machine 12 arbitrarily or in an orderly manner, for example, according to the identification numbers of the storage devices. Alternatively, the selection of the next storage device to be authorized could be made randomly, with the order of the permitted storage devices changing from time to time. According to another implementation, the selection of the next storage device is made according to a predefined scheduling.

The predefined scheduling employed by state machine 12 may factor in priority considerations. In such case, state machine 12 enables the current consumption of a particular storage device based also on a priority that is assigned to the particular storage devices.

A state in which one storage device has a higher priority over another storage device may result from an urgent need of first storage device to operate at a high current consumption level. Under such circumstances, state machine 12 may render one storage device longer (i.e., extended), and/or more frequent, current consumption periods over another storage device.

Storage devices SDa1 through SDaN may be prioritized based on one or more criteria selected from the group of criteria including, but not limited to, the type of content that is transferred to a particular storage device at a certain time, the specific storage device configuration, the degree of immunity to change in current consumption of a particular storage device, and the a level of activity of the storage device. Such criteria may be set on state machine 12 during configuration and/or provided to state machine 12 from an external device and/or from any other means, and received as input from a user for example.

For example, state machine 12 can determine to assign a high priority level to a particular storage device and to apply that priority when a certain type of information (e.g., BOOT information, information associated with the operating system, or any other important or operationally, or otherwise, critical user or system information) is to be transmitted to that storage device.

Prioritization of storage devices may be based on additional one or more criteria, or on alternative criteria. For example, state machine 12 may assign a storage device low priority level when the storage device is busy executing an operation that does not require high current or long time periods of high current consumption. According to another example, state machine 12 assigns a storage device low priority level when this storage device does not support the specific protocol between state machine and/or any of the other storage devices, when a storage device becomes bad and malfunctions, etc. Additionally or optionally, the state machine may assign a storage low priority level when the storage device is operating in sleep mode or in idle mode.

Note that the manner in which state machine 12 permits the current consumption of a particular storage device may vary from one storage system to another and from one point in time to another on the same storage system. Also note that state machine 12 may be provided with additional storage device management capabilities known to those skilled in the art, such as wear-leveling management, error correction code ("ECC") management, bad bock management, and data transfer management.

FIG. 2 is a block diagram of a storage system 20 according to another example embodiment. Storage system 20 includes an arrangement identical to that of storage system 10 shown in FIG. 1, except that in storage system 20 storage devices SDb1, SDb2, SDb3, . . . , SDbN are operatively interconnected in a wiring scheme known as "daisy chain". Briefly, "daisy chain" is a communication's bus wiring scheme in which, for example, device A is wired to device B, device B is wired to device C, etc. The last device is normally wired to a resistor or terminator. All devices may receive identical signals or, in contrast to a simple bus, each device in the chain may modify one or more signals before passing them on.

The operational connections between the storage devices may be physical connections or wireless connections. Further, the connection between the storage devices shown in FIG. 2 need not be via a direct communication channel. Accordingly, it is not required that a storage device be connected (either physically or wirelessly) to an adjacent storage device, nor it is required that a storage device be connected to only one storage device.

The connection between two adjacent storage devices (e.g., between storage devices SDb1 and SDb2) is facilitated by "Sync Out", "Ready In", "Sync In" and "Ready Out" communication ports. Each of storage device SDb1 through SDbN has these four ports, except for the firt storage device (i.e., storage device SDb1) and the last storage device (i.e., storage device SDbN): SDb1 has only a Sync Out port and a Ready In port and SDbn has only a Sync In port and a Ready Out port. Sync signals are transferred, or cascaded, downstream the daisy chain, from the Sync Out port of one storage device to the Sync In port of the next storage device to which it is connected (e.g., from SDb1 to SDb2), until the Sync signals reach the last storage device, which is SDbN in FIG. 2. Ready signals are transferred, or cascaded, in the opposite way (i.e., upstream the daisy chain), from the Ready Out port of one storage device to the Ready In port of the next storage device to which it is connected.

The connections C1', C2', C3', . . . , CN' between storage devices SDb1 through SDbN and a state machine 22 may be identical or similar to the connections C1, C2, C3, . . . , CN shown in FIG. 1. Communication links C1', C2', C3', . . . , CN' are used to forward storage commands and Enable signals to storage devices (SDb1, SDb2, SDb3, . . . , SDbN) respectively, which are issued by state machine 12. Communication links C1', C2', C3', . . . , CN' are also used to transfer current consumption information from storage devices SDb1, SDb2, SDb3, . . . , SDbN to state machine 12.

In the example shown in FIG. 2 a storage device may be permitted to consume high current in response to receiving a Sync signal from another storage device, and/or a permission message that is issued by state machine 22 as an Enable signal. An Enable signal that is transferred from state machine 22 to a particular storage device switches this storage device "on", thus enabling this device to respond to a Sync signal that may be received at any time thereafter.

A basic, non-limiting, mode of operation will now be described. State machine 12 is in communication with each of the storage device SDb1, SDb2, SDb3, . . . , SDbN via communication links C1', C2', C3', . . . , CN'. Storage device SDb1, SDb2, SDb3, . . . , SDbN, which, as mentioned above, are uniquely identified to state machine 12, are turned "off", not allowing them to consume high current consumption. State machine 22 may enable a particular storage device to allow that storage device to respond to a Sync signal according to a predefined scheduling that may be based on, or factor in, current consumption information that pertains to the remainder of the storage devices.

For the sake of the example, storage device SDb1 is initially permitted to enter a high current consumption state, which means that SDb1 is permitted to consume high current in response to receiving a corresponding Enable signal from state machine 22. So long as the Enable signal is valid, the storage device SDb1 can actually exercise consumption of high current or resume high current consumption in response to a Ready signal that SDb1 receives (via Ready In port of storage device SDb1) from storage device SDb2. Storage device SDb1 issues a Sync signal to storage device SDb2 (via Sync Out port of SDb2).

Storage devices SDb2, SDb3, . . . , SDbN operate differently than storage device SDb1. Again, each of storage devices SDb2, SDb3, . . . , SDbN are permitted to consume high current in response to receiving a corresponding Enable signal from state machine 22. So long as the Enable signal is valid, storage devices SDb2, SDb3, . . . , SDbN are operable to consume high current in response to a corresponding Sync signal that is received from storage devices SDb1, SDb2, . . . , SDbN−1 (via Sync In ports) respectively. Storage devices SDb2, SDb3, . . . , SDbN issue a Ready signal to storage devices SDb1, SDb2, . . . , SDbN−1 (via Ready Out ports) respectively.

Typically, a Ready signal received by storage devices SDb2, SDb3, . . . , SDbN−1 (from storage devices SDb3, SDb4, . . . , SDbN) are traversed to storage devices SDb1, SDb2, . . . , SDbN−2, respectively.

Since any of storage devices SDb1, SDb2, SDb3, . . . , SDbN may be in communication with any one or more storage devices residing in storage system 20, a particular storage device may further receive and/or transmit corresponding Sync/Ready signals to and from any one of the other storage devices in storage system 20, according to the specific configuration.

Note that any combination of the arrangements of FIGS. 1 and 2 and/or the functionalities of any of the components depicted in the arrangements of FIGS. 1 and 2 may also be applicable herein.

Figure 3:
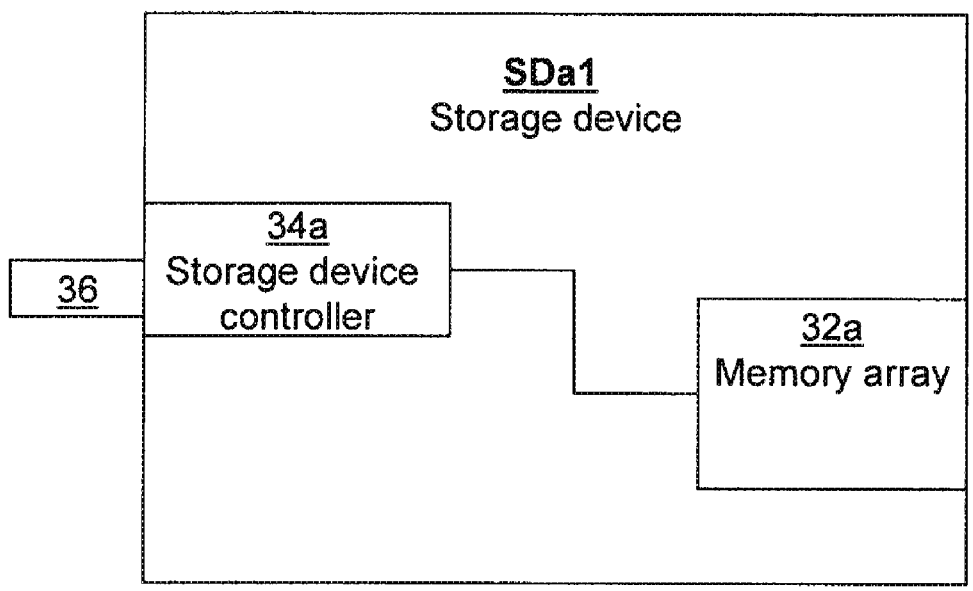
FIG. 3 shows in more detail a storage device of FIG. 1, according to an example embodiment.

FIG. 3 shows in more detail a storage device (storage device SDaN, for example) of FIG. 1, according to an example embodiment. Again, storage device SDaN is directly, or indirectly, connected to one or more other storage devices of the storage system, depending on the configuration.

Storage device SDaN includes circuitry typically including a storage portion, such as a memory array 32a, for storing data, and a storage device controller 34a. Storage device controller 34a is provided for managing the programming of data onto and the reading of data from the memory array 32a. Storage device controller 34a controls current consumption of the storage device SDaN in response to receiving a signal, such as a Sync signal, from a state machine, via an interface 36.

The state machine may be the state machine described, for example, with respect to the storage system in FIG. 1 and FIG. 2). Further as mentioned above, the storage device SDaN may be operable to convey a real-time indication of its current consumption level to the state machine, via interface 36.

Figure 4:
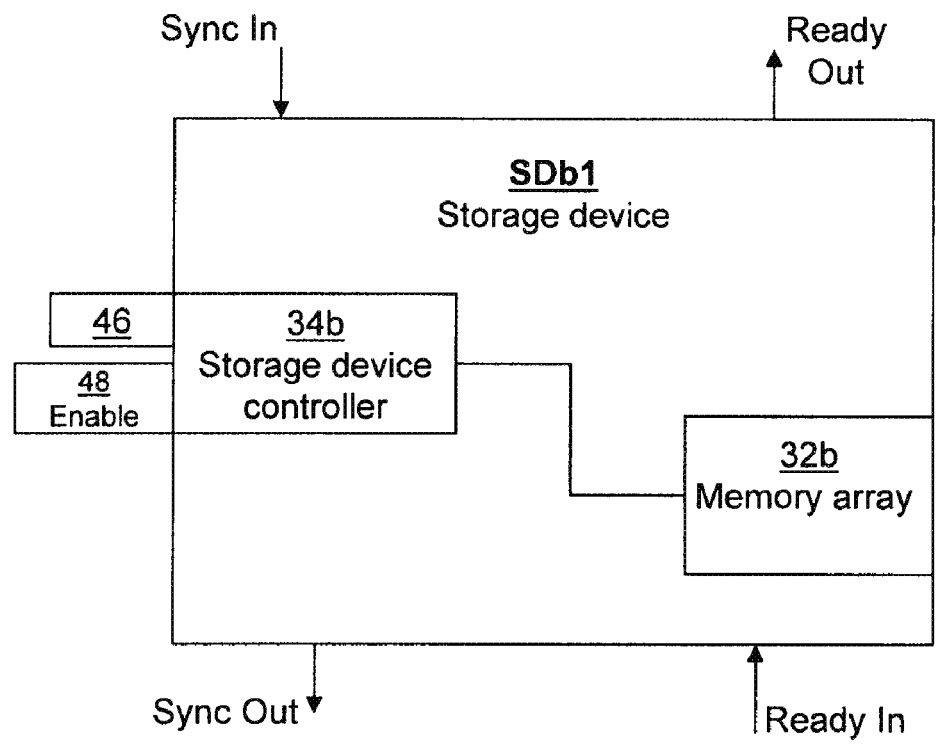
FIG. 4 shows in more detail a storage device of FIG. 2, according to another example embodiment.

FIG. 4 shows in more detail a storage device (storage device SDbN, for example) of FIG. 1, according to an example embodiment.

Storage device SDbN includes circuitry typically including a storage portion, such as a memory array 32b, for storing data, and a storage device controller 34b. Storage device controller 34b is provided for managing the programming of data onto and the reading of data from the memory array 32b. Storage device controller 34b controls current consumption of the storage device SDbN in response to receiving a signal, such a Sync signal, from a state machine, via an Enable port 48, and further based on an Enable signal that is received from another such storage device via a Sync In port. The Sync signal may be received at any point in time, either following or preceding the receipt of the storage operation command.

Storage device controller 34b is further operable to transmit Sync signals and Ready signals to other such storage device (typically being in direct connection with storage device SDbN), via Sync Out and Ready Out port connections respectively. When receiving a Ready signal, storage device SDb2 either conveys this Ready signal to another such storage device, via a Ready Out port connection, or enters a high current consumption state, depending on the specific configuration.

The Sync and Ready signals are issued in the same manner as described above, i.e. the Sync signals are transmitted for permitting the other storage device to commence operating at high current consumption level; and the Ready signals are transmitted for typically notifying the other storage device about no longer consuming high current.

As mentioned above, the state machine may be the state machine described, for example, with respect to the storage system in FIG. 1 and FIG. 2). Further as mentioned above, storage device SDbN may be operable to convey a real-time indication of its current consumption level to the state machine, via an interface 46.

FIG. 5 shows a table 100 for holding current consumption information, according to an exemplary embodiment. In general, table 100 provides information pertaining to current consumption requirements associated with storage devices SDa1, SDa2, SDa3, SDa4, and SDa5.

By way of example, table 100 provides current consumption information for storage devices that require 20 microseconds for consuming amount of 50 mA at high current consumption state; and require 30 microseconds for consuming amount of 7 mA.

In particular, table 100 includes field 110 for indicating amount of current (in milliAmpere) required by a storage device for operating at a high current consumption state; field 120 for indicating the time (in microseconds) that a storage device requires for operating at high current state, field 130 for indicating amount of current (in milliAmpere) required by a storage device for operating at a low current consumption state; field 140 for indicating the time (in microseconds) that a storage device requires for operating at low current state, field 150 for indicating priority, and field 160 for indicating the operational state.

Table 100 includes five exemplary entries where each entry refers to a different storage device. For example, entry 210 refers to storage device SDa1. SDa1 is operating and is assigned a high priority. Entry 220 refers to storage device SDa2. SDa1 is operating and is assigned a high priority as well.

Entry 230 and 250 refer to storage devices SDa3 and SDa5, respectively. As SDa3 is malfunctioning and SDa5 is set on sleep mode, both devices are assigned a low priority.

Entry 240 refers to storage device SDa4. SDa4 is operating and is assigned a medium priority. Under such circumstances, state machine 12 may render storage devices SDa1 and SDa2 longer (i.e., extended), and/or more frequent, current consumption periods over storage device SDa4.

Again, current consumption requirements is not limited to the exemplary values used herein, and may be based on other values, as discussed above.

Figure 6:
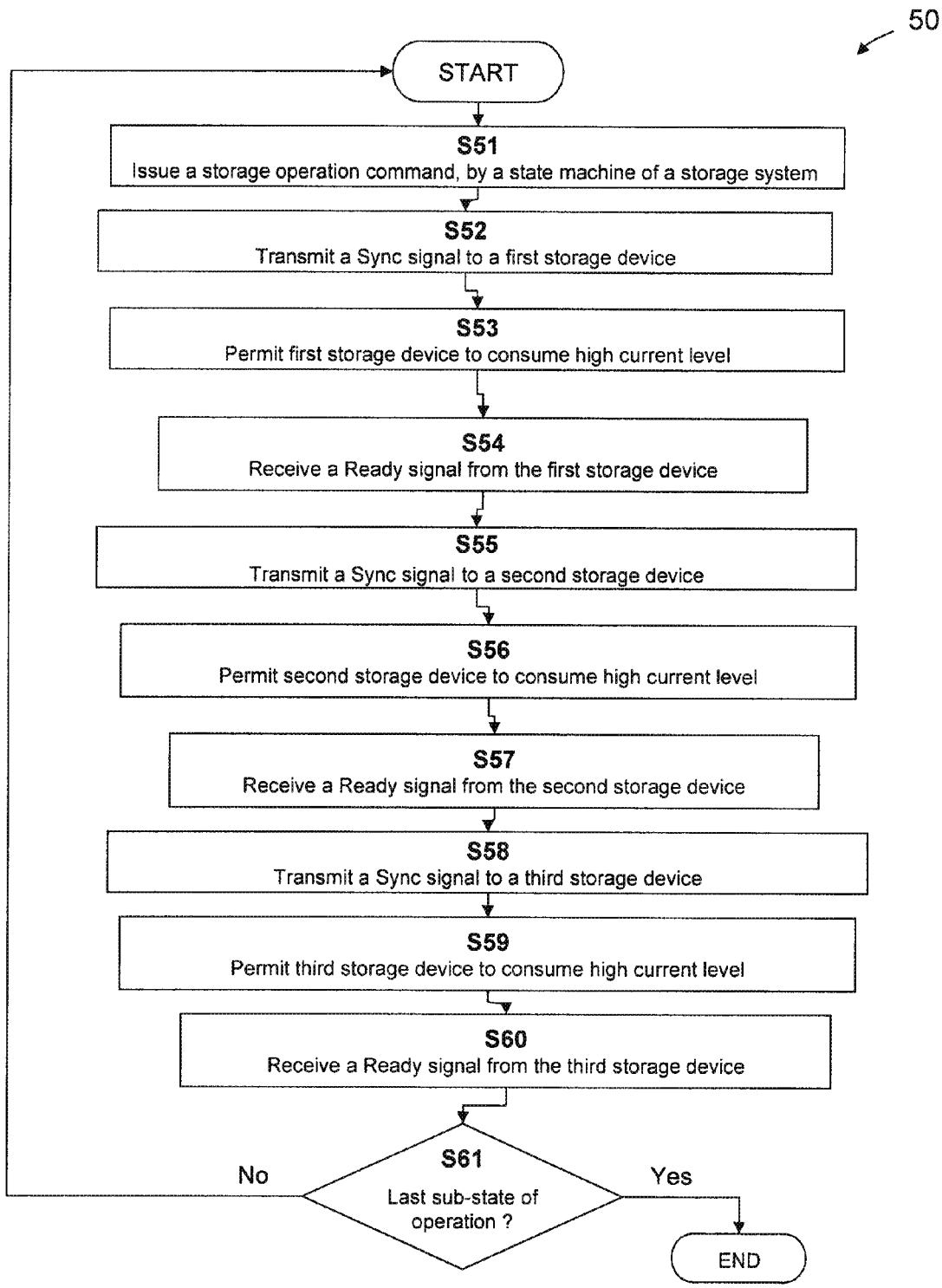
FIG. 6 shows an example method by which a state machine controls or manages a plurality of storage devices.

FIG. 6 shows an example method 50 by which a state machine controls or manages a plurality of storage devices. FIG. 6 will be described in association with FIG. 1. The method depicted herein may be employed by a state machine, such as state machine 13 of storage system 10, for managing operation of storage devices SDa1 through SDan. For the sake of the example, the method will be described using only storage devices SDa1, SDa2 and SDa3.

At the initial step S51, state machine 12, provided with communication links to the storage devices, issues a storage operation command. For mere example, the storage operation command issued herein is a programming command for storing data onto the three storage devices simultaneously.

At step S52, state machine 12 transmits a Sync signal to the first storage device, permitting the first storage device to operate at a high current consumption level (S53), while a second and a third storage device operate at a low current consumption level.

At step S54, state machine 12 receives a Ready signal from the first storage device, indicating that the first storage device is no longer operating at a high current consumption level.

Next at step S55 (after receipt of the Ready signal), state machine 12 transmits a Sync signal to the second storage device. This signal permits the second storage device to commence operating at a high current consumption level (S56), while the first and third storage devices operate at a low current consumption level.

At step S57, state machine 12 receives a Ready signal from the second storage device, indicating that the second storage device is no longer operating at a high current consumption level.

Next at step S58 (after receipt of the Ready signal), state machine 12 transmits a Sync signal to the third storage device. This signal permits the third storage device to commence operating at a high current consumption level (S59), while the first and second storage devices operate at a low current consumption level.

At step S60, state machine 12 receives a Ready signal from the third storage device, indicating that the third storage device is no longer operating at a high current consumption level.

After receipt of the Ready signal from the third storage device, state machine 12 determines whether it has reached the last sub-state in the current program operation (S61), i.e. whether the last Sync signal has been issued. If so the process ends; if not, the process returns to step S51.

Figure 7:
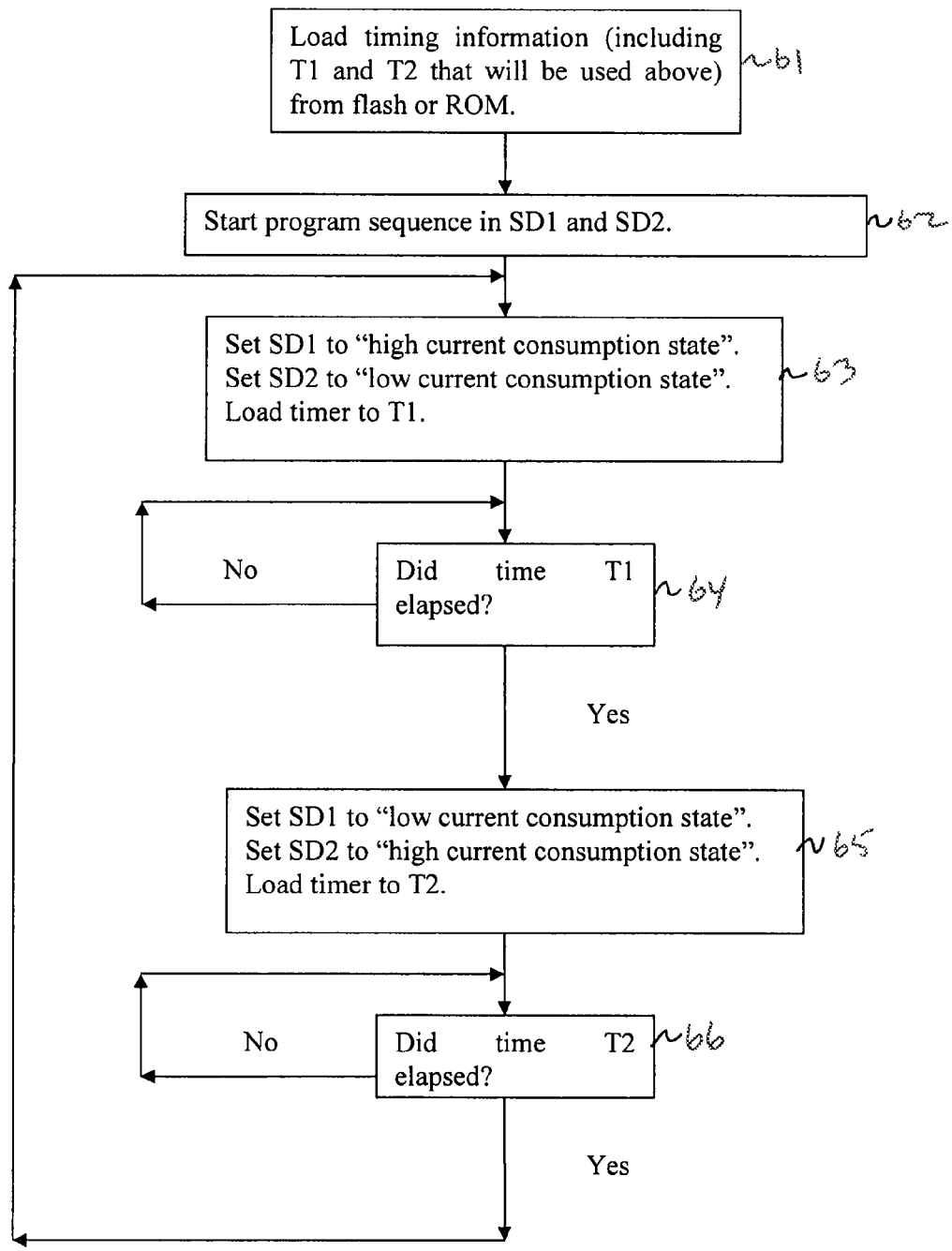
FIG. 7 shows an example method by which a state machine activates two storage devices.

FIG. 7 shows an example method 60 by which a state machine controls or manages two storage devices. FIG. 7 will be described in association with FIG. 1. At step 61 load timing information including T1 and T2 that will be used is loaded from FLASH or ROM. At 62, program sequence is started in SD1 and SD2. At step 63, SD1 is set to high current consumption state and SD2 is set to low current consumption state and timer is loaded to T1. At step 64, if time T1 has elapsed then SD1 is set to low current consumption state and SD2 is set to high current consumption sate and T2 is loaded to timer at step 65. At step 66, when time T2 has elapsed, control is passed back to step 63.

The order of operation of each storage device is brought here as an example only. Accordingly, the controller may transmit a Sync signals to any other storage devices according to a random order and/or according to any other predefined order.

As will be appreciated by those familiar in the art, current technologies employ a wide variety of different architectures and it is expected that new architectures will continue to be developed. In general, the exemplary embodiments may be employed in conjunction with a wide variety of different types of memory, so long as the storage device has suitable processing power.

The embodiments, various examples of which are described herein, may be realized in hardware, software, or a combination of hardware and software. A typical combination of hardware and software could be a general purpose computer system with a computer program that, when being loaded and executed, controls the computer system such that it carries out the methods described herein. The concepts described above can also be embedded in a computer program product, which comprises all the features enabling the implementation of the embodiments described herein, and which, when loaded in a computer system is able to carry out these embodiments. Computer program or application in the present context means any expression, in any language, code or notation, of a set of instructions intended to cause a system having an information processing capability to perform a particular function either directly or after either or both of the following a) conversion to another language, code or notation; b) reproduction in a different material form.

Having described the various embodiments of systems and a method, it is to be understood that the description is not meant as a limitation, since further modifications will now suggest themselves to those skilled in the art, and it is intended to cover such modifications as fall within the scope of the appended claims.

The invention claimed is:

1. A method of managing operation of a plurality of storage devices, the method comprising:
   receiving current consumption information from at least one of the plurality of storage devices; and
   managing operation of at least one of the plurality of storage devices, the operation management including
   providing a start signal to a first one of a plurality of storage devices that initiates power consumption at a high current level in the first storage device;
   switching the first one of the storage devices to a low current level;
   providing a completion signal from the first one of the storage devices upon completion of power consumption at a high current level;
   receiving the completion signal at one of a state machine or a next one of the plurality of storage devices indicating that said first storage device has completed the power consumption at the high current level; and
   providing second start signal to one of the state machine and the next one storage device and initiating power consumption at a high current level in the next storage device while the rest of the plurality of storage devices operate at low current level.

2. The method of claim 1, wherein the current consumption information includes a real-time indication of current consumption of at least a second one of the plurality of storage devices, and wherein the current consumption information is dynamically updated.

3. The method of claim 1, wherein the managing further includes (a) programming of data onto the first one of the plurality of storage devices, erasing of data from the first one of the plurality of storage devices, and reading of data stored on the first one of the plurality of storage devices, or (b) programming of data onto the next one of the plurality of storage devices, erasing of data from the next one of the plurality of storage devices, and reading of data stored on the next one of the plurality of storage devices, based on the current consumption information.

4. The method of claim 1, wherein the permitting includes suspending current consumption of the first one of the plurality of storage devices and permitting current consumption of another one of the plurality of storage devices to be resumed, based on the current consumption information, or permitting current consumption of the first one of the plurality of storage devices to be resumed and suspending current consumption of another one of the plurality of storage devices, based on the current consumption information.

5. A method of managing operation of a plurality of storage devices, the method comprising:
   receiving current consumption information from at least one of the plurality of storage devices; and
   managing operation of at least one of the plurality of storage devices, the operation management including permitting current consumption of a first one of the plurality of storage devices based on current consumption information that pertains to at least a second one of the plurality of storage devices; and
   further comprising connecting at least one of the plurality of storage devices directly to another one of the plurality of storage devices.

6. The method of claim 5, wherein the first one of the plurality of storage devices is directly connected to at least another one of the plurality of storage devices, and wherein the current consumption of the first one of the plurality of storage devices is permitted in response to a signal received by the first one of the plurality of storage devices from at least the second one of the plurality of storage devices.

7. The method of claim 1, wherein said providing of the start signals is based on a priority assigned to at least one of the plurality of storage devices.

8. The method of claim 7, wherein the priority is based on a degree of immunity to change in current consumption, a level of activity, a type of content associated with and/or a configuration of the at least one of the plurality of storage devices to which the priority is assigned.

9. A storage system comprising:
   a plurality of storage devices, each of the plurality of storage devices being configured to store data; and
   a state machine connected to each of the storage devices, the state machine being operative to manage operation of at least one of the plurality of storage devices, the operation management including permitting current consumption of a first one of the plurality of storage devices based on current consumption information that pertains to at least a second one of the plurality of storage devices wherein said current consumption information indicates a fixed predefined scheduling that is indicative of expected timing of different current consumption levels.

10. The storage system of claim 9, wherein at least one of the plurality of storage devices has a configuration complying with flash memory technology.

11. The storage system of claim 9, wherein at least one of the plurality of storage devices is a dedicated non-removable storage devices that is not removable from the apparatus.

12. The storage system of claim 9, wherein at least one of the plurality of storage devices is a removable storage device that is configured for removal from and addition to the storage system, the removable storage device including a memory card.

13. A storage device operationally connected to a state machine and to one or more other storage device, the storage device comprising:
   a storage portion configured to store data; and
   circuitry operative to manage operation of the storage portion, the operation management including permitting current consumption of the storage device based on current consumption information that pertains to at least one other storage device operationally connected to the storage device, the permitting of the current consumption being carried out based on a command received from one of a state machine or a directly connected one or more storage device.

14. A device for managing a plurality of storage devices, the device comprising:
   a state machine operationally connected to a plurality of storage devices, the state machine being operative to manage operation of at least one of the plurality of storage devices, the operation management including
   receiving a ready signal from a first one of the storage devices indicating that it is ready perform power consumption at a high current level;
   providing a start signal to the first one of the plurality of storage devices, the start signal enabling the power consumption at a high current level in the first storage device;

receiving a completion signal from the first one of the storage devices upon its completion of power consumption at a high current level indicating that the first one of the storage devices has completed power consumption at a high current level and switched to a low current level operational mode;

receiving a second ready signal from another one of the storage devices indicating that it is ready perform power consumption at a high current level;

providing a second start signal to the another storage device, the second start signal enabling the power consumption at a high current level in the another storage device; and receiving a completion signal from the another storage device upon its completion of power consumption at a high current level indicating that the another storage device has completed power consumption at a high current level and switched to a low current level operational mode; and iteratively receiving ready signals and receiving completion signals from selected storage devices of the plurality of storage devices enabling the provision of start signals to said selected storage devices.

15. The storage device of claim 14 wherein the state machine defines priorities for storage devices that enable selective usage of storage device power consumption at a high power level.

16. A method as recited in claim 1 wherein, the plurality of storage devices are in direct communication with the state machine and are not in direct communication with each other, and wherein the providing of the start signal to a first one of a plurality of storage devices comprises providing the start signal from the state machine;

wherein receiving the completion signal comprises receiving the completion signal from the first storage device at the state machine; and wherein the providing of the second start signal to the next storage device comprises providing the providing of the second start signal from the state machine.

17. A method as recited in claim 16 wherein the providing a start signal to a first storage device that initiates power consumption at a high current level in the first storage device further includes operating the rest of the plurality of storage devices operate at a low current level.

18. A method as recited in claim 1 wherein, wherein the providing of the start signal to a first one of a plurality of storage devices comprises providing the start signal from a prior storage device of the plurality of storage devices;

providing a completion signal from the first one of the storage devices to said prior storage device of the plurality of storage devices;

wherein receiving the completion signal comprises receiving the completion signal from the first storage device at said prior storage device thereby indicating that said first storage device has completed the power consumption at a high current level;

wherein receiving the completion signal comprises receiving the completion signal at the prior storage device; and wherein the providing of the second start signal comprises providing the second start signal to the next storage device enabling it to initiate power consumption at a high current level.

* * * * *